United States Patent
Filoramo et al.

(10) Patent No.: US 7,126,413 B2
(45) Date of Patent: Oct. 24, 2006

(54) METHOD AND CORRESPONDING CIRCUIT STRUCTURE TO CORRELATE THE TRANSCONDUCTANCE OF TRANSISTORS OF DIFFERENT TYPES

(75) Inventors: Pietro Filoramo, Syracuse (IT); Giovanni Calì, Catania (IT)

(73) Assignee: Simicroelectronics, S.R.L., Agrate Brianza (IT)

(*) Notice: Subject to any disclaimer, the term of this patent is extended or adjusted under 35 U.S.C. 154(b) by 78 days.

(21) Appl. No.: 10/883,577

(22) Filed: Jun. 30, 2004

(65) Prior Publication Data

US 2005/0035817 A1    Feb. 17, 2005

(30) Foreign Application Priority Data

Jun. 30, 2003    (EP)    ................... 03425430

(51) Int. Cl.
*G01R 19/00*    (2006.01)
*H03F 3/04*    (2006.01)
*H03F 3/16*    (2006.01)

(52) U.S. Cl. ................ 330/2; 330/296; 330/300
(58) Field of Classification Search ............ 330/2, 330/300, 296, 261
See application file for complete search history.

(56) References Cited

U.S. PATENT DOCUMENTS

| 5,587,687 | A | * | 12/1996 | Adams ................. 330/253 |
| 5,714,906 | A | * | 2/1998 | Motamed et al. ....... 327/563 |
| 6,124,760 | A | | 9/2000 | Hong |
| 6,154,017 | A | * | 11/2000 | Contreras ............. 323/315 |
| 6,218,902 | B1 | * | 4/2001 | Kung ................. 330/261 |
| 6,529,564 | B1 | * | 3/2003 | Brown ................ 375/318 |
| 6,531,919 | B1 | | 3/2003 | Carter |
| 6,630,864 | B1 | * | 10/2003 | Yang ................. 330/254 |

FOREIGN PATENT DOCUMENTS

| EP | 0 597 420 | 5/1994 |
| GB | 2 369 508 | 5/2002 |

OTHER PUBLICATIONS

Rezzi F et al., "A 3V Pseudo-Differential Transconductor with Intrinsic Rejection of the Common-Mode Input Signal", Proceedings of the Midwest Symposium on Circuits and Systems, Lafayette, Aug. 3-5, 1994, New York, IEEE, US, vol. 1 Symp. 37, Aug. 3, 1994, pp. 85-88.
European Search Report for EP 03 42 5430 dated Dec. 18, 2003.

* cited by examiner

*Primary Examiner*—Patricia Nguyen
(74) *Attorney, Agent, or Firm*—Lisa K. Jorgenson; Bryan A. Santarelli; Graybeal Jackson Haley LLP

(57) ABSTRACT

A method and related circuit structure correlate the transconductance value of transistors of different type, for example MOS transistors and bipolar transistors. The structure comprises a first differential cell formed by transistors of the first type and a second differential cell formed by transistors of the second type connected to each other by means of a circuit portion responsible for calculating an error signal obtained as difference between the cell differential currents and applied to said first differential cell and to an output node of the same circuit structure obtaining a transconductance correlation independent from process tolerances and temperature.

33 Claims, 9 Drawing Sheets

METHOD AND CORRESPONDING CIRCUIT STRUCTURE TO CORRELATE THE TRANSCONDUCTANCE OF TRANSISTORS OF DIFFERENT TYPES

PRIORITY CLAIM

This application claims priority from European patent application No. 03425430.0, filed Jun. 30, 2003, which is incorporated herein by reference.

TECHNICAL FIELD

The present invention relates generally to a method and relevant circuit structure for correlating the transconductance value of transistors of different types, independently from process tolerances and temperature.

BACKGROUND

As is well known, under small-signal conditions, the output current $i_{OUT}$ of a transistor is proportional to the input voltages $v_{in}$ applied thereto by a proportionality coefficient called transconductance $g_m$.

This transconductance generally varies with temperature and process parameters as a function of the chosen transistor type and of the particular integration process. Therefore, different types of transistors have transconductances that are typically uncorrelated to each other and that are variable with respect to temperature according to convenient laws.

For example, a bipolar NPN transistor and a NMOS transistor are shown with reference to FIG. 1, whose input-output relation under low-signal conditions are respectively:

$$i_c = g_{mBJT} \cdot V_{in1} \quad (1)$$

$$i_d = g_{mMOS} \cdot V_{in2} \quad (2)$$

the respective transconductance expressions are:

$$g_{mBJT} \equiv \frac{\alpha \cdot I_E}{v_T} \quad (3)$$

$$g_{mMOS} = 2\sqrt{K_n \cdot \frac{W}{L} \cdot I_D} \quad (4)$$

where
- α is the current gain of the common-base-configured bipolar transistor
- $v_T$ is the thermal voltage
- W/L is the form factor of MOS transistors
- $K_n$ is a process constant of the NMOS transistor being proportional to the mobility $\mu_n$ and to the oxide specific capacity $C_{ox}$
- $I_E$ is the emitter bias current of the bipolar transistor Q1
- $I_D$ is the bias current of the MOS transistor M1

From a comparison between the expressions (3) and (4) it is evident that the transconductances of the two types of transistors depend on different process parameters and they also have different laws of variation with temperature and they are thus generally uncorrelated.

At present, there is no effective solution for correlating the transconductance values of different types of transistors, i.e., to achieve a relation like the following one being mediated by a proportionality coefficient γ.

$$G_{m\_TYPE1} = \gamma \cdot g_{m\_TYPE2}$$

SUMMARY

Therefore, an embodiment of the present invention provides a method for correlating the transconductances of at least two different types of transistors, independently from process tolerances and temperature and by means of a proportionality coefficient.

In an embodiment of the invention, a circuit structure comprises a pair of differential cells, each cell being formed by a differential pair of transistors of the same type, interconnected to each other by means of a circuit portion responsible for calculating the error signal between the difference of respective differential currents, and using this error signal, in one case conveniently amplified, to bias one of the two differential pairs and simultaneously drive the same circuit structure output.

A correlation between the respective transconductances of the different types of transistors of the first and second cell is therefore obtained, which is totally independent from process tolerances and temperature.

BRIEF DESCRIPTION OF THE DRAWINGS

Features and advantages of the method and circuit structure according to the invention will be apparent from the following description of embodiments thereof given by way of non-limiting example with reference to the attached drawings.

DETAILED DESCRIPTION

Figure 1:
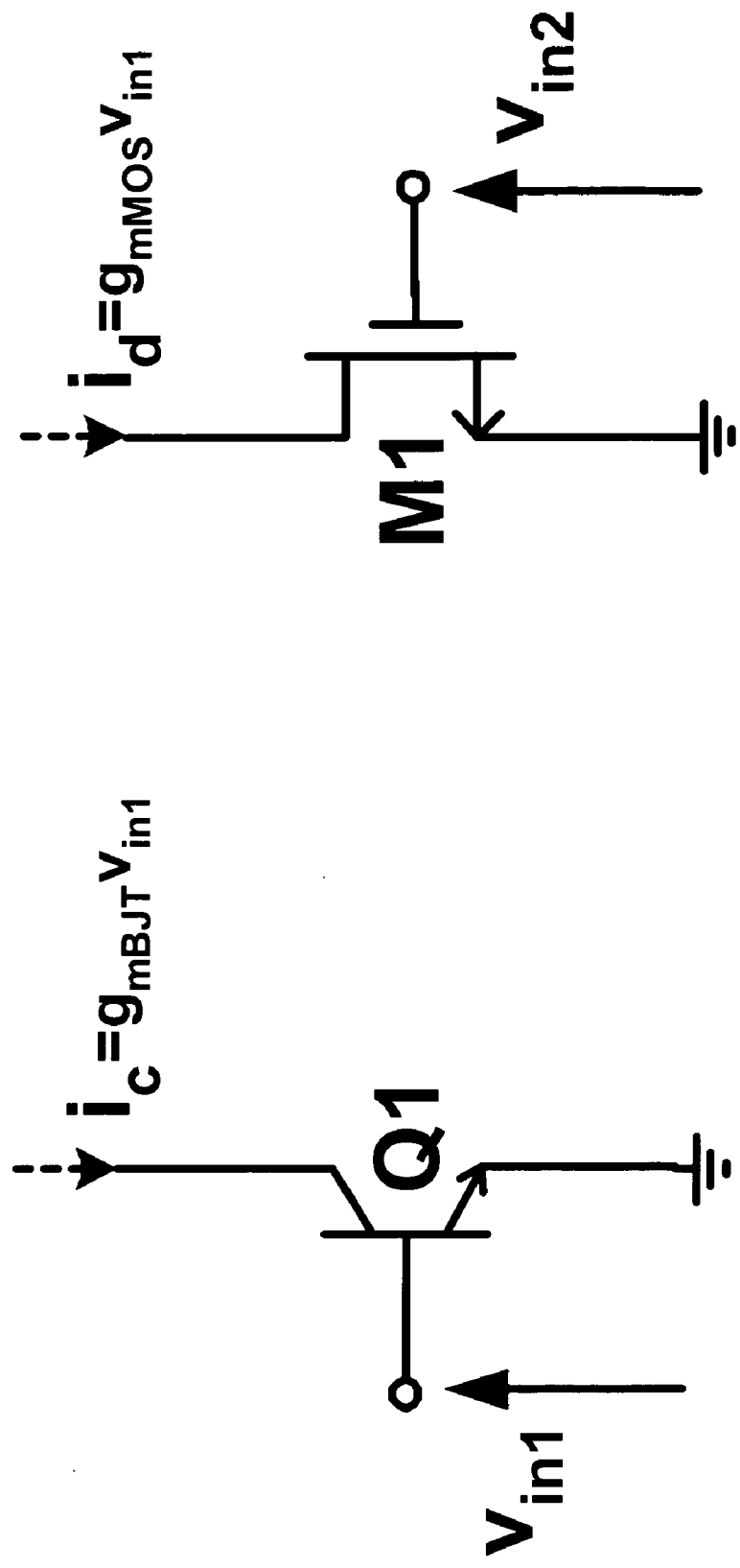
FIG. 1 shows the comparison between a bipolar NPN transistor and a NMOS transistor and the relevant voltages and currents.
Figure 2:
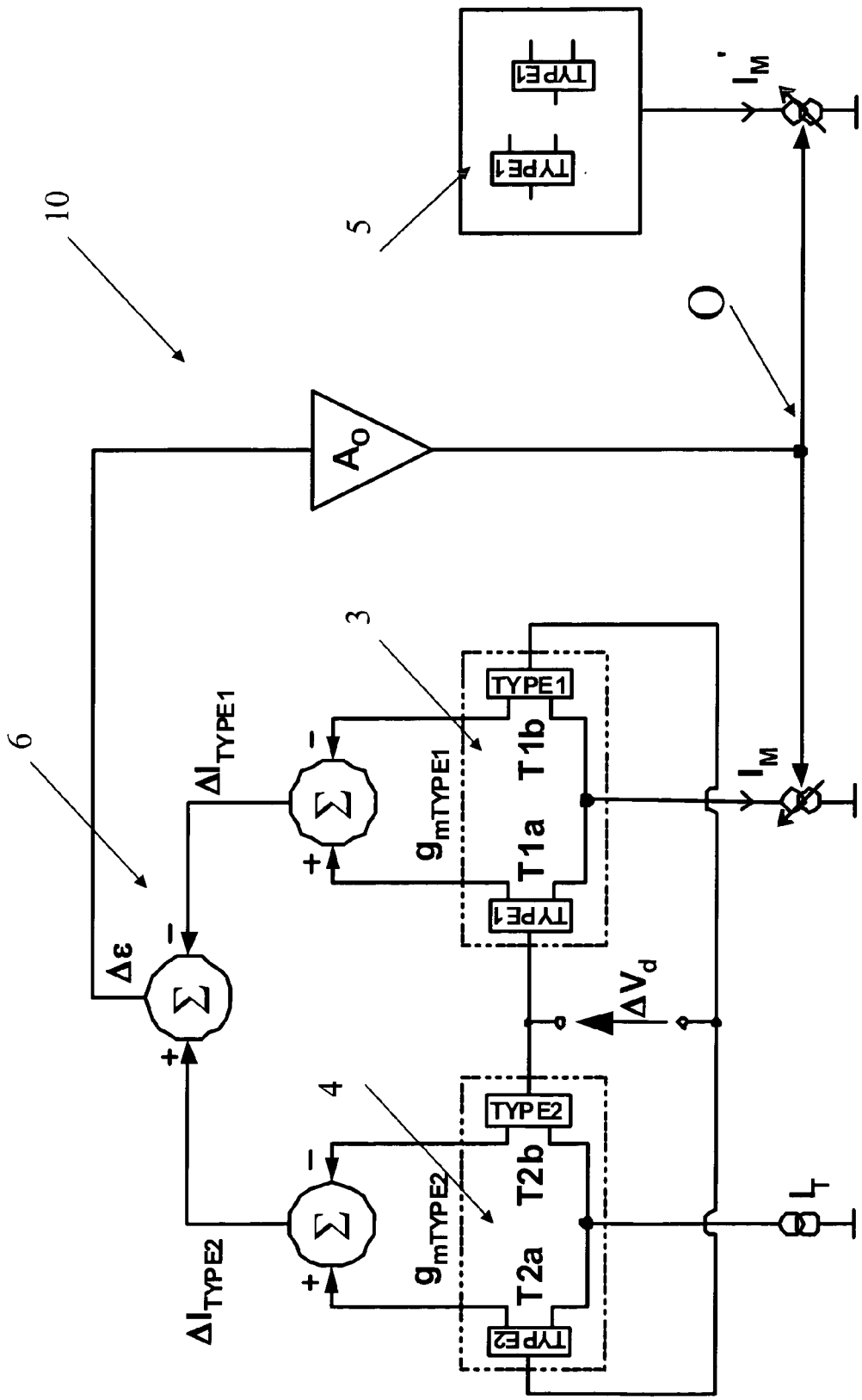
FIG. 2 shows a circuit structure manufactured according to an embodiment of the invention to correlate the transconductances of at least two different types of transistors.

With reference to these drawings, and particularly to the example of FIG. 2, a circuit structure comprising a first and a second differential cell 3 and 4, which are connected to each other according to an embodiment of the present invention to correlate the transconductances of at least two different types of transistors, is globally and schematically indicated with 10.

The first cell 3 comprises a differential pair of a first type 1 (TYPE1) of transistors T1*a*, T1*b*, while the second cell 4 comprises a differential pair of a second type 2 (TYPE2) of transistors T2*a*, T2*b*.

Cells 3 and 4 are interconnected by means of a current mirror circuit portion 6, comprised in the structure 10, responsible for generating an error signal Δε related to the difference of the two cell differential currents, as it will be more apparent in the following description. This current error signal is applied, in an amplified way, to the output node O of the structure 10. This error signal is thus used to bias the first differential cell in order to obtain a feedback inside the structure 10.

According to the diagram of FIG. 2, the transconductances of transistors of different type are correlated to each other independently from process tolerances and temperature, by a proportionality coefficient. In other words, for said two general types of transistors, type 1 and type 2, the following correlation is obtained:

$$gm\_TYPE1 = \gamma \cdot gm\_TYPE2$$

γ being a proportionality coefficient drawn by the ratio between homologous quantities and thus independent both from the temperature and from process tolerances.

In FIG. 2 it can be seen that the first differential cell 3 is connected to a first potential reference, for example a signal ground GND, by means of a current source $I_M$, whose driving terminal is connected to the output node O.

Applied to the second differential pair 4 of transistors of type 2 is a bias current $I_T$ and a constant differential voltage $\Delta V_d$, which is sufficiently small as to consider the small-signal approximation valid. Under such conditions, the differential current $\Delta I_{TYPE2}$ of the second differential pair of transistors of type 2 is:

$$\Delta I_{TYPE2} \cong g_{mTYPE2} \Delta V_d \quad (5)$$

Similarly, by applying the same voltage difference $\Delta V_d$ to the first differential pair 3 of type 1, the respective differential output current $\Delta I_{TYPE1}$ is:

$$\Delta I_{TYPE1} \cong g_{mTYPE1} \Delta V_d \quad (6)$$

Therefore, where Δε is the error signal related to the difference of the two differential currents and ψ the proportionality coefficient of the input-output relation of the current source $I_M$, the following result is obtained:

$$i_m = \psi \cdot A_0 \cdot \Delta\epsilon = \psi \cdot A_0 \cdot (\Delta I_{TYPE2} - \Delta I_{TYPE1}) \quad (7)$$

from which, by replacing (5) and (6) it results:

$$i_M = \psi \cdot A_0 \cdot (g_{mTYPE2} - g_{mTYPE1}) \cdot \Delta V_d \quad (8)$$

By virtue of the small-signal approximation, it can be assumed that the dependence law of the transconductance $g_{mTYPE1}$ of type 1 from the small-signal current $i_M$ is linear and, thus, ρ being the proportionality coefficient, the following result is obtained:

$$g_{mTYPE1} = \rho \cdot i_M \quad (9)$$

from which, by replacing (8):

$$g_{mTYPE1} = \rho \psi \cdot A_0 \cdot (g_{mTYPE2} - g_{mTYPE1}) \cdot \Delta V_d \quad (10)$$

from which finally, making the transconductance of type 1 explicit, the following result is obtained:

$$g_{mTYPE1} = \frac{\rho \cdot \psi \cdot A_O \cdot \Delta V_d}{1 + \rho \cdot \psi \cdot A_O \cdot \Delta V_d} g_{mTYPE2} \quad (11)$$

By manufacturing the error amplifier so that the gain $A_O$ is such as to make the product $\rho \cdot \psi \cdot A_O \cdot \Delta V_d$ sufficiently high, then the transconductance of the differential pair 3 of type 1 will tend to equal the transconductance of the differential pair 2 of type 2, i.e.:

$$g_{m\_TYPE1} \cong g_{mTYPE2} \quad (12)$$

In the common application the value of $A_O$ is determined in order to ensure the desired static precision $$\frac{\Delta g_m}{g_m},$$

according to the following relation:

$$\frac{\Delta g_m}{g_m} = \frac{1}{\rho \cdot \psi \cdot A_O \cdot \Delta V_d} \quad (13)$$

When the condition (12) between the differential pairs 4 and 3 of type 2 and of type 1 is satisfied, the bias current $I_M'$, obtained from the current IM by means of a current mirror ratio, can be used to bias general circuit blocks comprising transistors of type 1 and generally indicated by block 5. Between the transistors of the general block 5 of type 1 and those of type 2 the following relation is satisfied:

$$g_{m\_TYPE1} \cong \gamma \cdot g_{mTYPE2} \quad (14)$$

whose proportionality coefficient will depend only on the mirror ratio $$\frac{I'_M}{I_M}$$

and on type 1 transistor size ratio.

Figure 3:
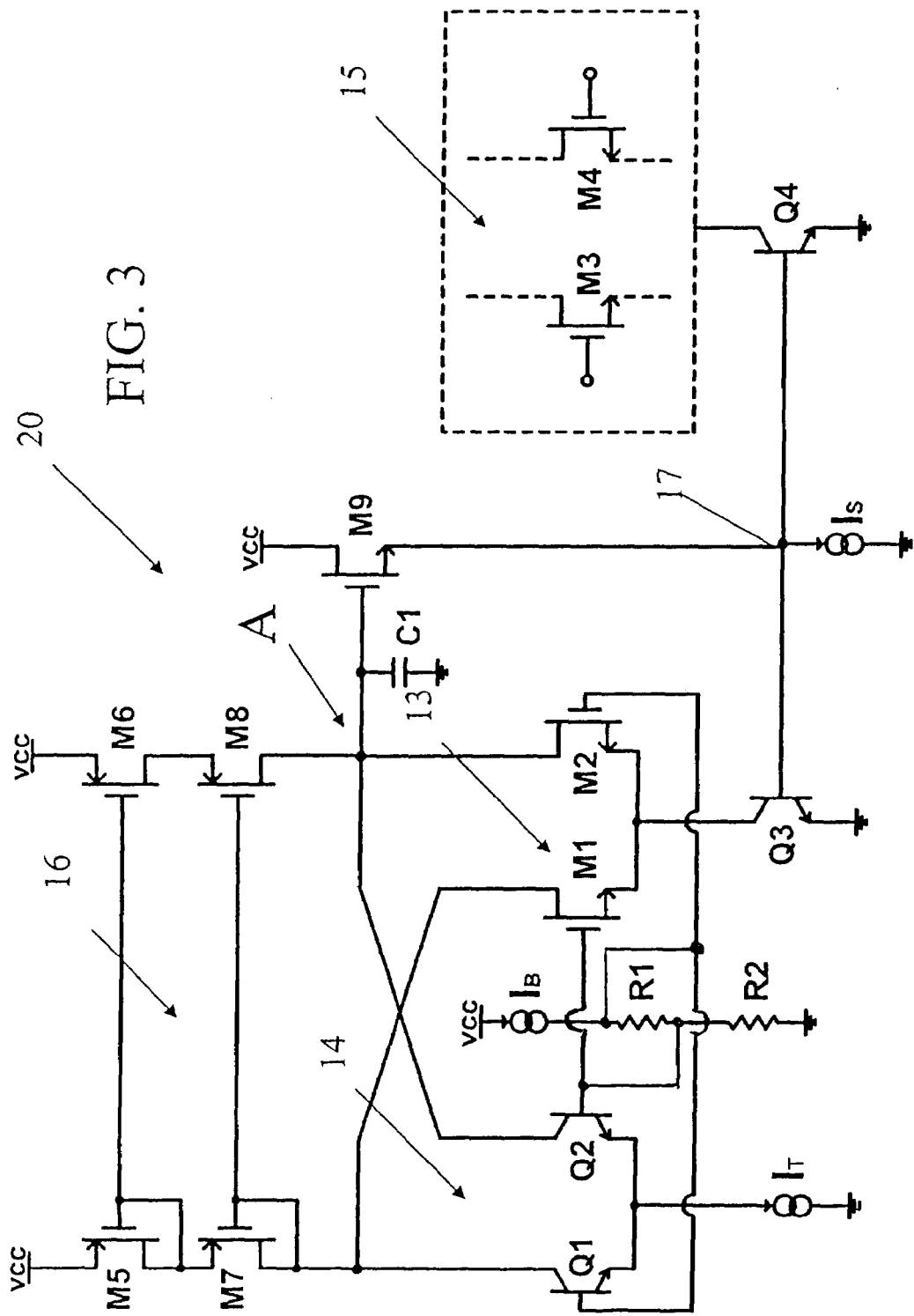
FIG. 3 shows in greater circuit detail a possible embodiment of the example of FIG. 2.

A possible BiCMOS technology implementation of the circuit structure of FIG. 2 is shown in FIG. 3 with the numeral 20 according to an embodiment of the invention.

In this embodiment the MOS transistor transconductance has been correlated to the bipolar transistor one.

In this example a first MOS transistor differential cell 13 is connected to a second bipolar transistor differential cell 14 by means of a current mirror circuit portion 16 being cascode-connected and comprising MOS transistors M5–M8. A bipolar transistor Q3 operates as a current source for the first differential cell 13.

It is, however, possible that the circuit portion 16 is manufactured with bipolar transistors. Similarly, also the current source, manufactured by means of the bipolar transistor Q3, can be manufactured by means of a MOS transistor.

The circuit operation is the following. The bipolar transistor differential pair 14 is biased by a queue current $I_T$, the value of the respective transconductance is thus $$g_{mBJT} \equiv \frac{\alpha \cdot I_T}{2 \cdot v_T}.$$

Each input differential pair is biased by the common mode voltage $I_B \cdot R_2$ and it is excited by the constant differential voltage $\Delta V_d = I_B \cdot R_1$. The latter is fixed sufficiently low ($\Delta V_d << 2v_T$) as to consider the following small-signal approximation valid:

$$\Delta I_{BJT} = \alpha \cdot I_T \cdot \tanh\left(\frac{\Delta V_d}{2v_T}\right) \cong g_{mBJT} \cdot \Delta V_d \quad (15)$$

where the differential current of the second bipolar transistor differential pair 14 has been indicated with $\Delta I_{BJT}$. Under such conditions, similarly for the first MOS transistor differential pair 13, the following result is obtained:

$$\Delta I_{MOS} \cong g_{mMos} \cdot \Delta V_d \quad (16)$$

The cascode M5–M8 current mirror 16 performs both the difference between the two differential currents $\Delta I_{BJT}$ and $\Delta I_{MOS}$ and the current-voltage conversion through the dynamic resistance in the interconnection node A between respective conduction terminals of the transistors M2 and M8, thus producing an "error signal" $\Delta v_\epsilon$. The use of a cascode mirror 16 with respect to a simple mirror advantageously provides a higher accuracy and considerably reduces the systematic equivalent input offset. Therefore the so-obtained error signal $\Delta v_\epsilon$ has the following expression:

$$\Delta v_\epsilon = (\Delta I_{BJT} - \Delta I_{MOS}) \cdot r_{OUT} \cong (g_{mBJT} - g_{mMOS}) \cdot r_{OUT} \Delta V_d \quad (17)$$

A transistor M9, located at the output of the structure 20 in follower configuration, provides again the same error signal $\Delta v_\epsilon$ at the output node 17 thereof coinciding with the transistor Q3 base. Therefore, $g_{m3}$ being the transistor Q3 transconductance, the following result is obtained:

$$g_{mMOS} = \xi \cdot g_{m3} \cdot \Delta v_\epsilon \quad (18)$$

$\xi$ being the proportionality coefficient of the current-transconductance relation achieved though the linearization of the expression (4), i.e.:

$$g_{mMOS} = \xi \cdot i_{c3} \quad (19)$$

Combining the (17) and the (18) a similar relation to the one seen in general terms is obtained:

$$g_{mMOS} = g_{mBJT} \cdot \frac{\xi \cdot g_{m3} \cdot r_{OUT} \cdot \Delta V_d}{1 + \xi \cdot g_{m3} \cdot r_{OUT} \cdot \Delta V_d} \quad (20)$$

Therefore for sufficiently high gain values $A_0 = g_{m3} \cdot r_{OUT}$ the transconductance of the MOS differential couple tends to the one of the bipolar differential pair, i.e.

$$g_{mMOS} \cong g_{mBJT} \quad (21)$$

A current source Q4, obtained in this embodiment by means of a bipolar transistor, connects the output 17 to a group 15 of MOS transistors which indicates a general MOS transistor circuit portion.

When the queue current generator Q3 is manufactured by means of a MOS transistor, the current source Q4 should also be manufactured by means of a MOS transistor in order to keep the mirror factor between the queue generator currents unchanged.

The current $I_{C4}$ of the transistor Q4, obtained from the bias current $I_{C3}$ through the ratio of the areas of transistors Q4 and Q3, can thus be used to bias circuits 15 using NMOS transistors. The transconductance $g_{mMOS}^*$ of these NMOS transistors will be therefore equal to the one of the cell 14 comprising the pair of bipolar transistors Q1–Q2, conveniently reduced by the ratio of the current mirror factor formed by the transistors Q3, Q4, this mirror factor being equal to the ratio of the emitter areas of these transistors Q4 and Q3 and of the ratio of NMOS transistor form factors, i.e.:

$$g_{mMOS}^* \cong \gamma \cdot g_{mBJT} \quad (22)$$

A possible use of this circuit is the generation of a bias current effective to keep the voltage gain of MOS transistor amplifiers 15 having a gain of the $g_{mMOS} \cdot R_L$ type in BICMOS technology applications constant when the temperature varies.

Generally, MOS transistor amplifiers, having a gain of the $g_{mMOS} \cdot R_L$ type, are biased by means of a current $I_{BIAS}$ drawn as ratio between the difference of $V_{GS}$ of two MOS transistors and an allocated resistance having the same temperature variation coefficient of the load resistance, i.e.:

$$I_{BIAS} = \frac{\Delta V_{GS}}{R^*} \quad (23)$$

$$\text{where } \frac{1}{T}\frac{\partial}{\partial T}R^* \equiv \frac{1}{T}\frac{\partial}{\partial T}R_L$$

Through simple mathematical steps it can be demonstrated that the law (23) offsets in temperature both the transconductance $g_{mMOS}$ variation and the load resistance $R_L$ variation, and thus it offsets temperature voltage gain variations. By way of example FIG. 4 shows a possible bias circuit 19 implementing said law.

Figure 4:
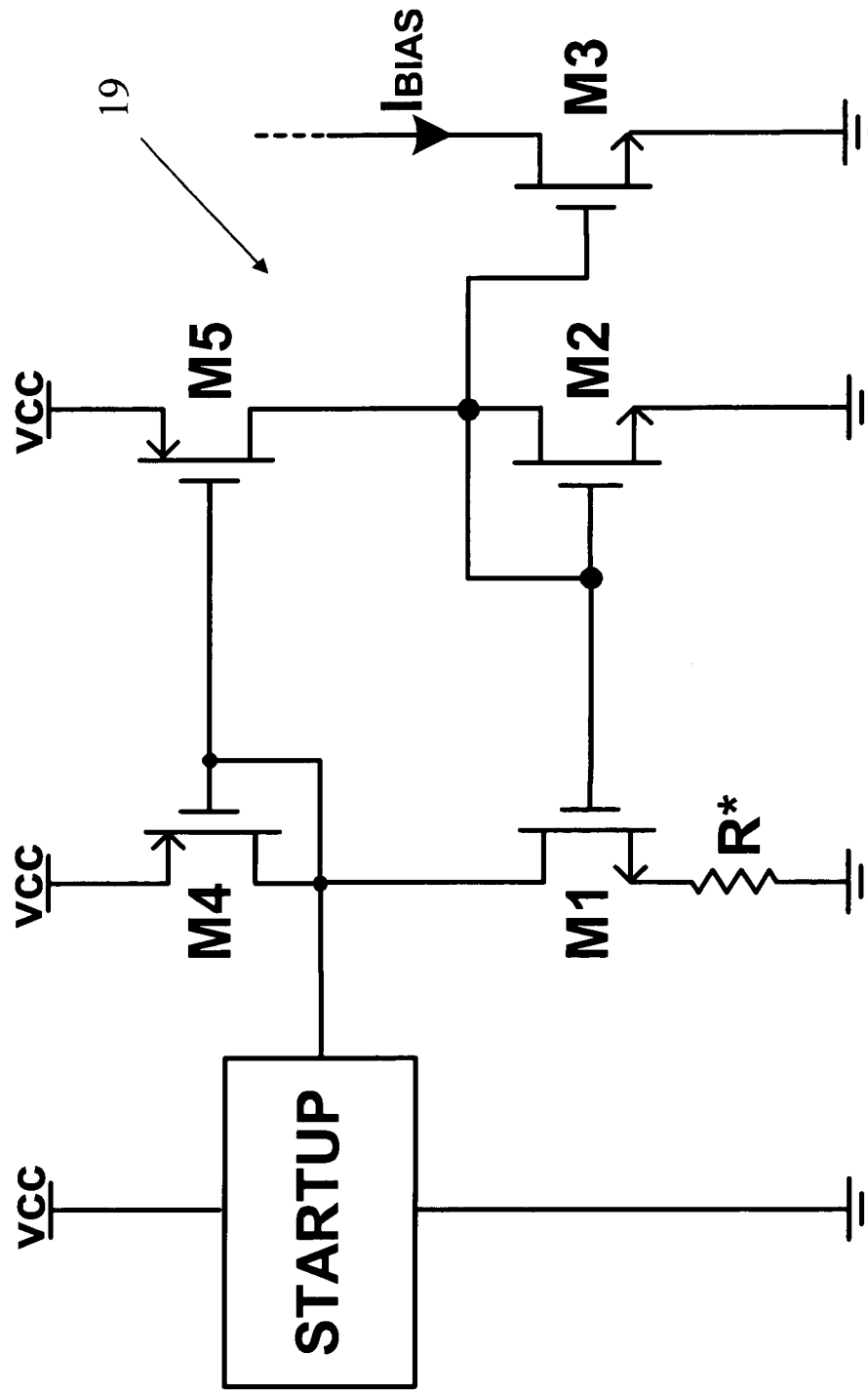
FIG. 4 shows a MOS transistor amplifier circuit structure, in BICMOS technology, with compensation of the variations with the temperature of the voltage gain according to the prior art.

In a dual way, for bipolar transistor circuits, the voltage gain is offset in temperature by circuits being similar to the one of FIG. 4 producing a bias current which is proportional to the absolute temperature (PTAT).

Usually in BICMOS technology integrated circuits, the two typologies of MOS transistor and bipolar transistor amplifiers use each a convenient bias circuit to offset gain variations in temperature.

On the contrary, according to an embodiment of the present invention, by using a compensation circuit structure, it is possible to use a single current bias reference for both typologies of amplifiers.

Figure 5:
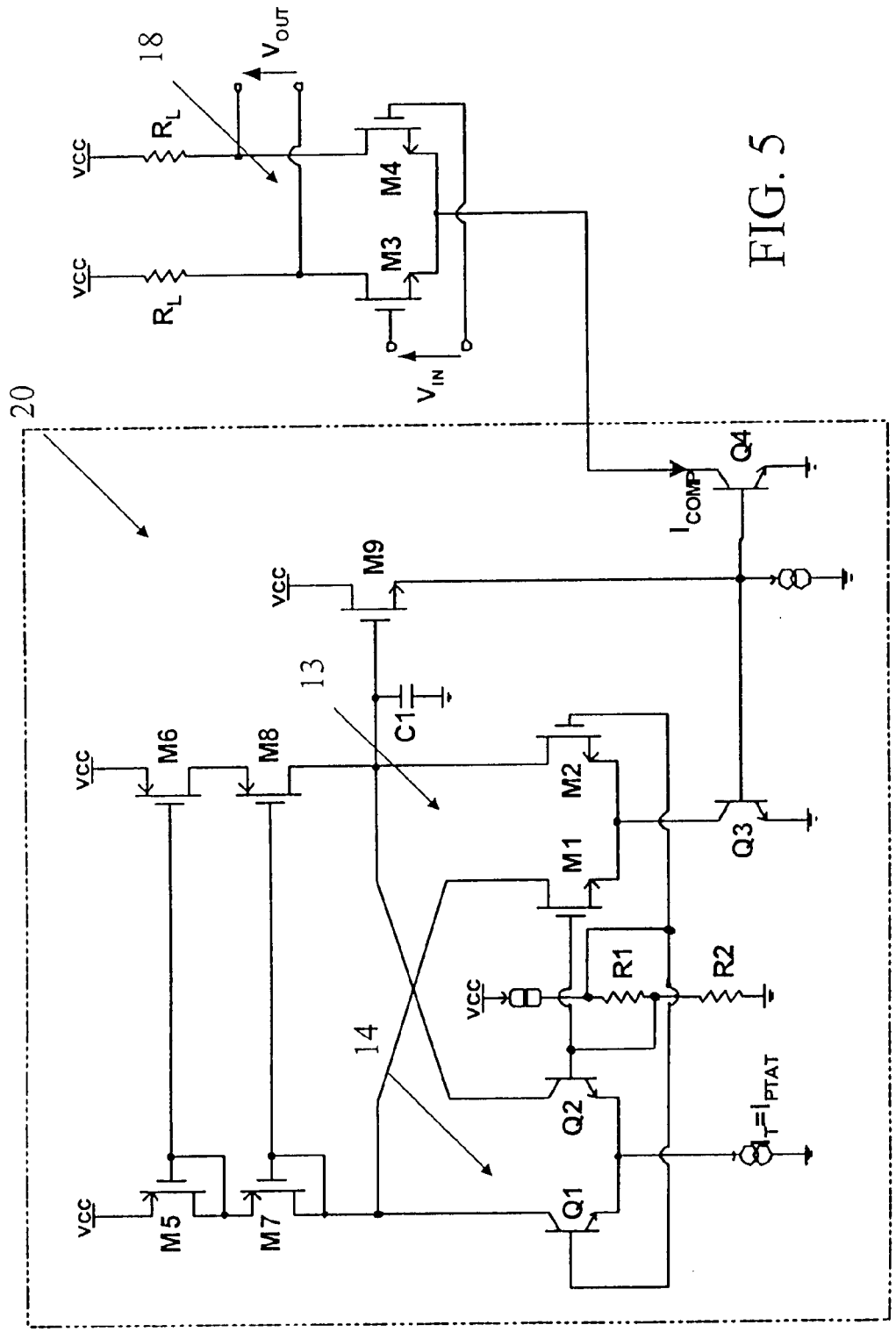
FIG. 5 shows a circuit structure according to an embodiment of the invention being output-connected to a MOS transistor amplifier.

For example, with reference to FIG. 5, since the relation (22) applies for any process and temperature condition, it is possible to bias the bipolar differential pair 14 Q1–Q2 with a queue current (current generator IT) drawn from a PTAT bias circuit, and to use thus the output current of the transistor Q4 collector to bias MOS transistor amplifiers 18 having a $g_{mMOS \cdot RL}$ gain, as indicated in figures. The compensation in temperature of the bipolar transistor pair transconductance therefore provides via the relation (22) that the transconductance of MOS transistors is also constant when the temperature varies.

The use of the circuit structure according to an embodiment of the invention is particularly advantageous in biasing circuits having an extremely limited current consumption and those using, for accuracy reasons, external reference resistances. In fact, in the first case, by using a single current reference for both typologies of transistors, the silicon area occupation is considerably reduced, halving the area commonly dedicated to the resistances of current references R*. In the second case, the use of said bias system allows two temperature-constant-gain current references to be obtained starting from a single external reference, to the advantage of the number of components used and of the whole application cost.

In a dual way, the method provided can be naturally applied to bias bipolar differential couples starting from a current reference for MOS transistor amplifiers with the same above-mentioned advantages.

Figure 6:
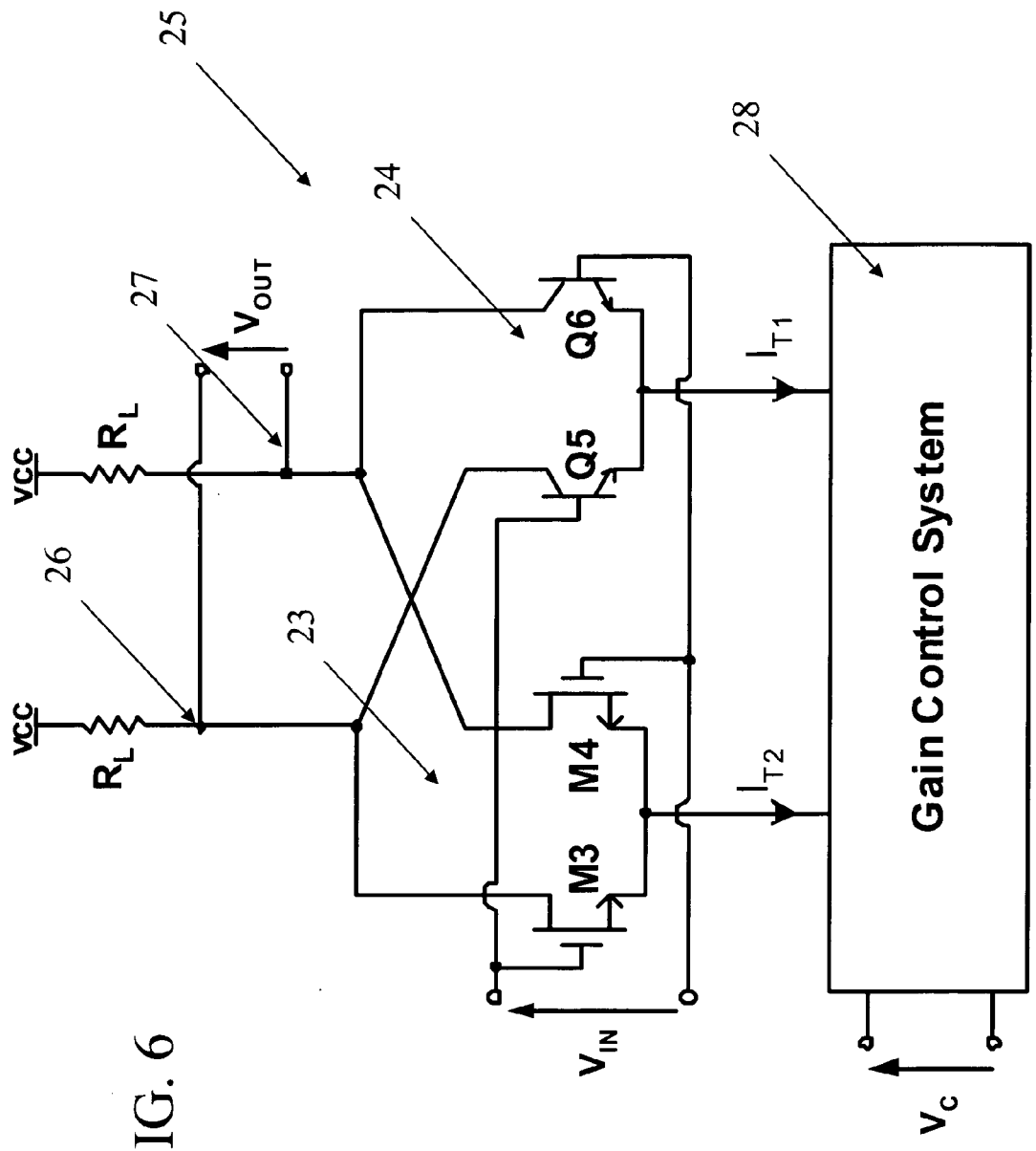
FIG. 6 shows a variable gain amplifier allowing, in association with a circuit structure according to an embodiment of the invention, the amplifier output dynamic range to remain constant when the process and the temperature vary.

Another possible use of such a circuit is the generation of a bias system effective to keep constant the output dynamic range of a variable gain amplifier 25 of the type shown in FIG. 6 when the temperature and the process vary.

Variable gain amplifiers 25, of the type shown in FIG. 6, are used in some typologies of receivers requiring a high gain low noise performance and a low gain high linearity performance. The circuit operation is the following. The two differential pairs 23, 24 perform the voltage-current conversion starting from the same input signal $V_{IN}$ thus generating two current differential signals $g_{mMOS} \cdot V_{IN}$ and $g_{mBJT} \cdot V_{IN}$ which add on output nodes 26, 27. The current-voltage conversion is performed by two load resistances $R_L$. The voltage gain expression of this amplifier is thus:

$$A_V(I_{T1}, I_{T2}) = [g_{mBJT}(I_{T1}) + g_{mMOS}(I_{T2})] \cdot R_L \quad (24)$$

A control circuit portion 28 provides the queue currents $I_{T1}$ and $I_{T2}$ as function $\Gamma$ of the control signal $V_C$.

$$(I_{T1}, I_{T2}) = \Gamma(V_C) \quad (25)$$

Figure 7:
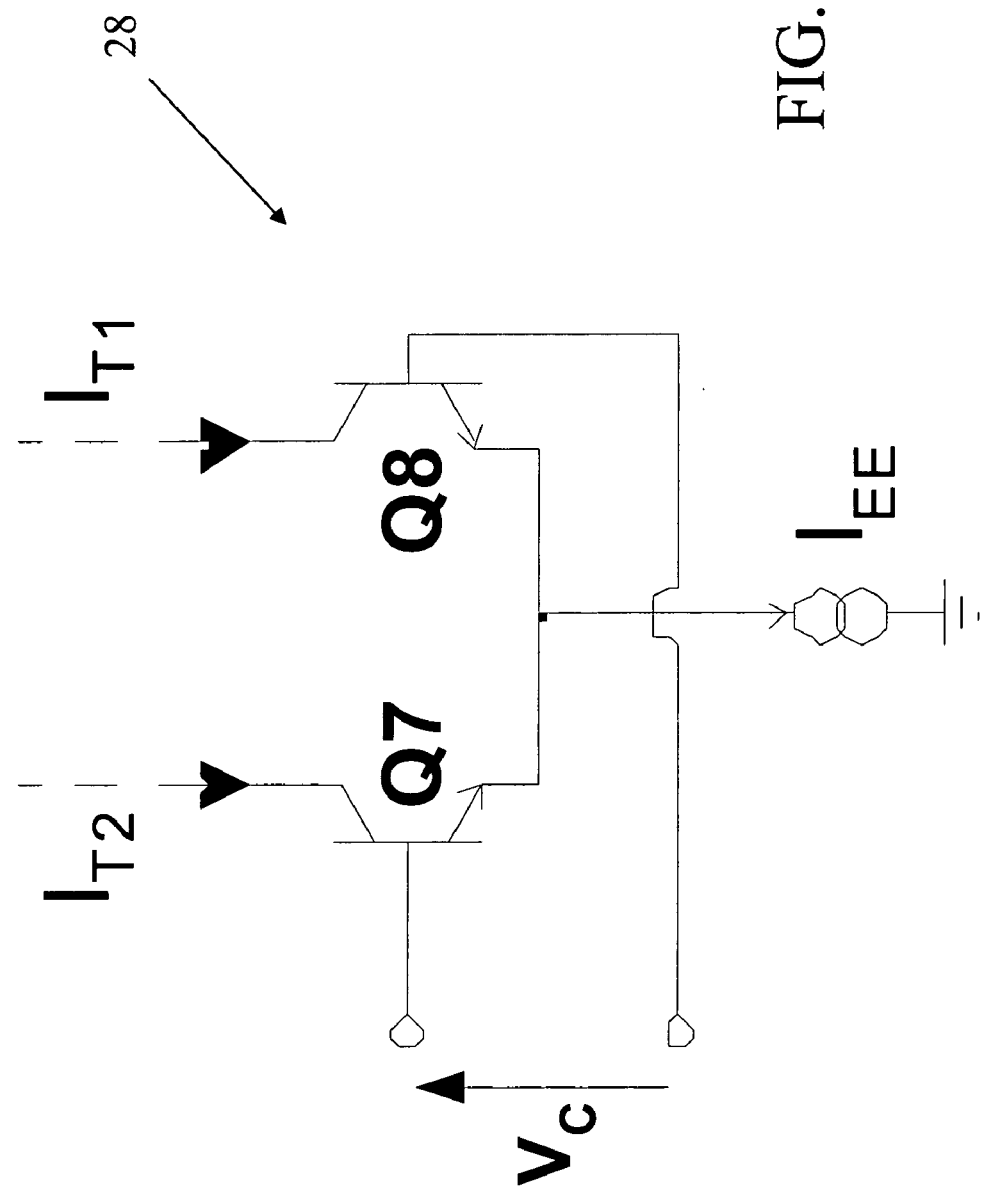
FIG. 7 shows a detail of the amplifier of FIG. 6 according to an embodiment of the invention.

Therefore, once the intervention of the control circuit portion 28 fixed, the amplifier gain is a function of the control voltage $V_C$. An embodiment of the control circuit portion 28 which can be used is shown in FIG. 7.

In such a control circuit 28, which is known, the current $I_{EE}$ is deviated on the output branches according to the control voltage VC, according to the following relation.

$$I_{T1} = \frac{\alpha \cdot I_{EE}}{1 + \exp\left(\frac{V_C}{V_T}\right)}, \quad I_{T2} = \alpha \cdot I_{EE} - I_{T1} \quad (26)$$

Therefore, by using this control circuit 28, under both extreme gain conditions (for $V_C \ll 0$ and $V_C \gg 0$), only a differential pair 23 or 24 is active and biased by the current $\alpha \cdot I_{EE}$.

Supposing that the bipolar pair 24 transconductance is higher than the MOS couple 23 transconductance, the output dynamic range, considered as the ratio between the highest and the lowest gain value, is:

$$\frac{A_V \text{ MAX}}{A_V \text{ MIN}} = \frac{g_{mBJT}}{g_{mMOS}} = \frac{\frac{\alpha \cdot I_{EE}}{V_T}}{2\sqrt{K_n \cdot \frac{W}{L} \cdot \alpha \cdot I_{EE}}} \quad (27)$$

Two important limits derive from this latter expression:
Since both transconductances depend on uncorrelated process parameters the output dynamic range considerably varies with process tolerances.

The temperature control law applied to the current $I_{EE}$ generation can offset only one of the two transconductances, therefore the output dynamic range will considerably vary with temperature.

Figure 8:
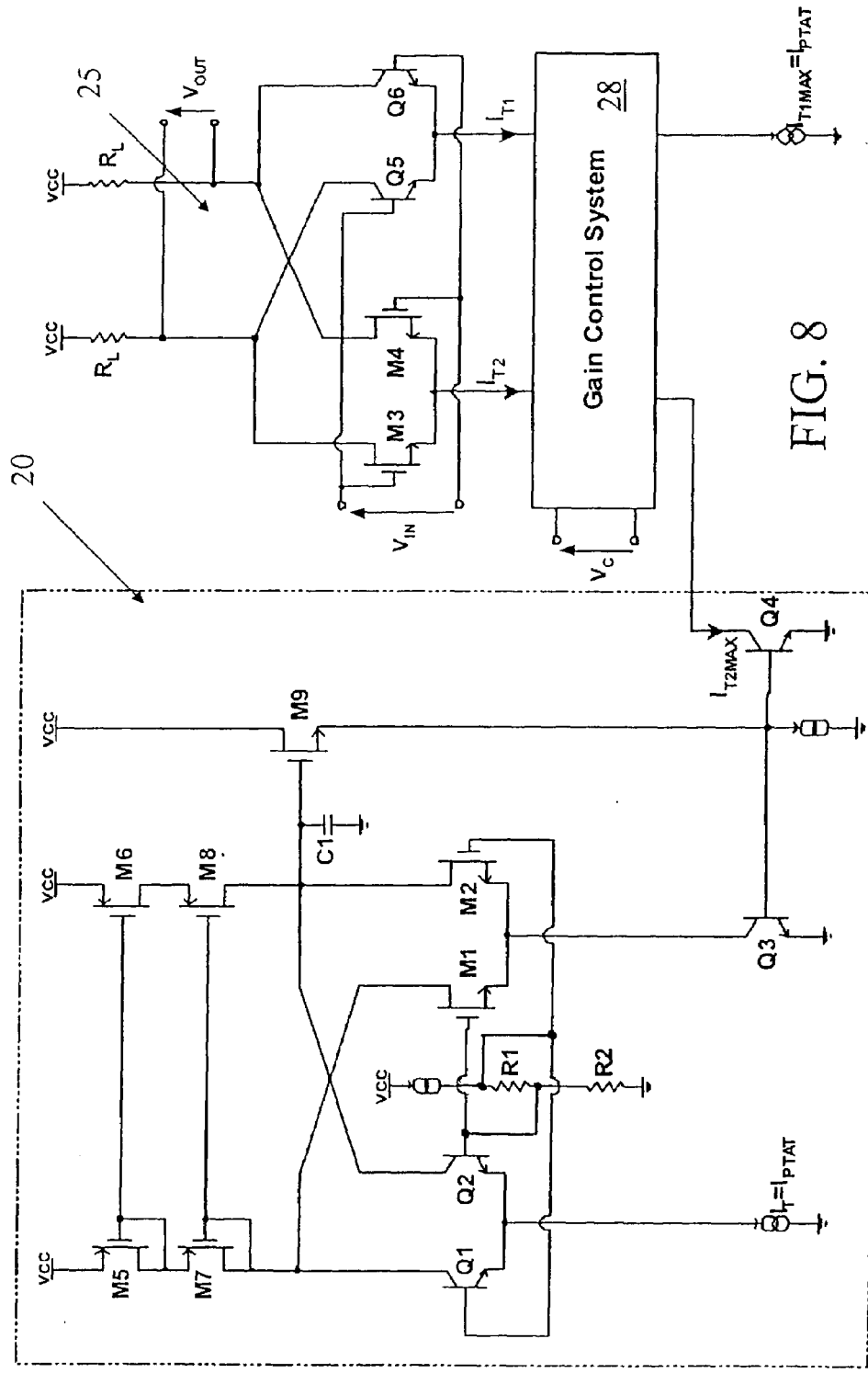
FIG. 8 shows a circuit structure according to an embodiment of the invention being output-connected to a variable gain amplifier.

By applying the circuit structure 20 according to an embodiment of the invention according to the scheme of FIG. 8 both above-mentioned problems can be solved.

The basic idea is to provide the gain-control circuit portion 28 with the two bias currents $I_{T1MAX}$ and $I_{T2MAX}$ so that the same control circuit 28 provides them as queue currents to the differential pairs Q5–Q6 and M3–M4 under both extreme gain conditions. By applying this scheme to the expression (22), the output dynamic range is the following:

$$\frac{A_V \text{ MAX}}{A_V \text{ MIN}} = \frac{g_{mBJT}}{g_{mMOS}} = \frac{g_{mBJT}}{\gamma \cdot g_{mBJT}} = \frac{1}{\gamma} \quad (28)$$

where $\gamma$ is a very accurate proportionality factor since it depends only on the ratio between form factors and emitter areas, and it is therefore independent from process and temperature variations. Therefore under these conditions the output dynamic range is very accurate and independent from temperature variations.

Figure 9:
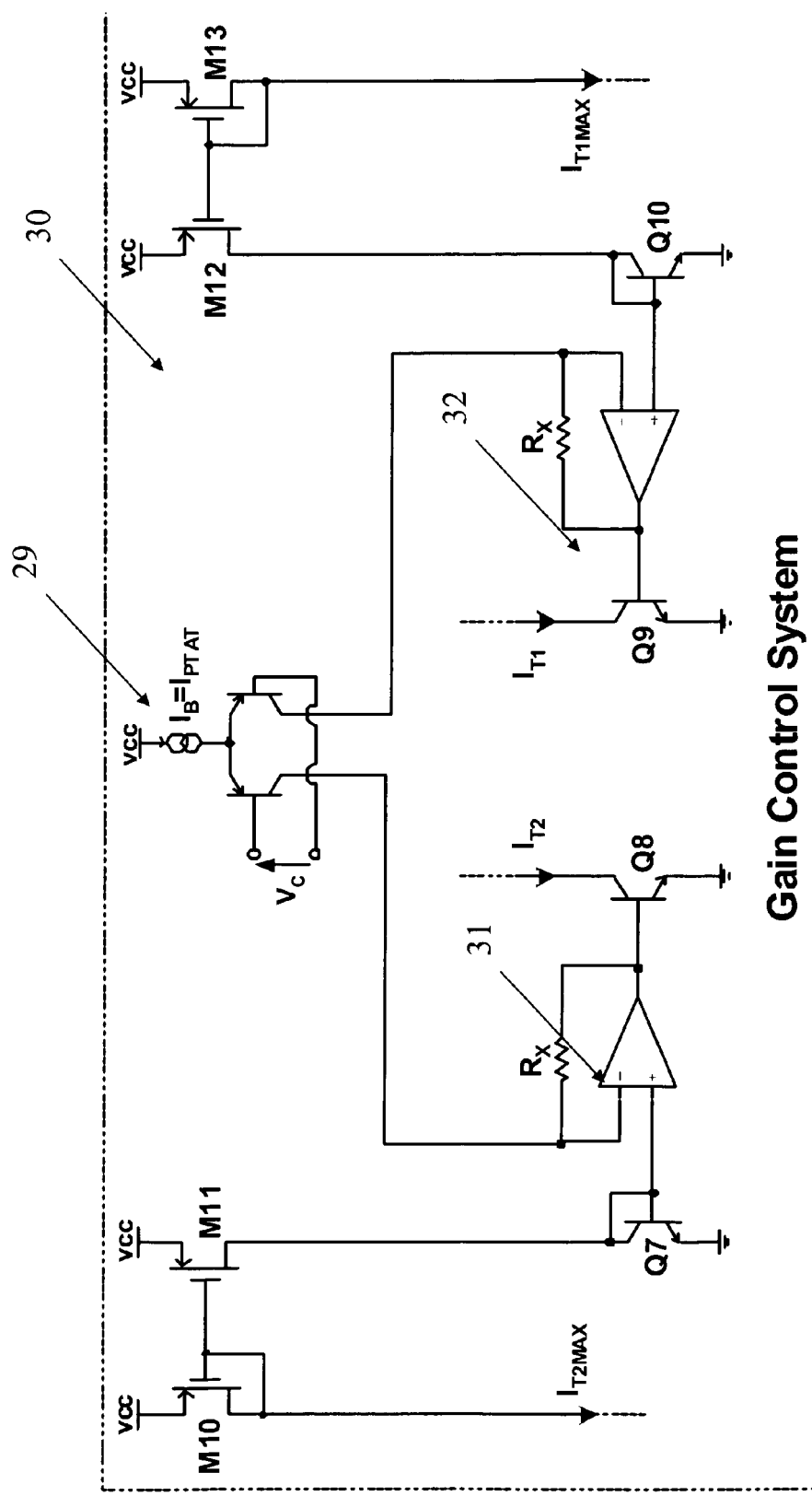
FIG. 9 schematically shows a detail of the embodiment of FIG. 8.

Moreover, by generating the bias currents $I_T$ and $I_{T1MAX}$ starting from a PTAT current reference and using a control circuit 30 whose variation law $\Gamma(V_C)$ is independent from the temperature, also the absolute value of the voltage gain (expression (24)) will not depend on the temperature. An example of control circuit 30 is shown in FIG. 9 wherein a current reference $I_{PTAT}$ can be seen, indicated with 29, to supply respective circuit branches 31, 32 equipped with differential amplifiers arranged to drive respective output transistors Q8, Q9.

A voltage reference obtained from a corresponding bias current $I_{T1MAX}$, $I_{T2MAX}$ is also applied to each amplifier, and by means of a current mirror circuit portion.

The method and the circuit structure according to the above embodiments of invention solve the technical problem and allow the transconductances of at least two different types of transistors to be correlated, independently from process tolerances or temperature and by means of a proportionality coefficient.

An integrated circuit may incorporate one or more of the circuits discussed above in FIGS. 2–9, and an electronic system may incorporate such an integrated circuit.

From the foregoing it will be appreciated that, although specific embodiments of the invention have been described herein for purposes of illustration, various modifications may be made without deviating from the spirit and scope of the invention.

What is claimed is:

1. A method for correlating the transconductance value of transistors of different types, for example MOS transistors and bipolar transistors, wherein that it:
   provides a circuit structure comprising a first differential cell formed by transistors of the first type and a second differential cell formed by transistors of the second type;
   applies to the first and second differential cell, biased through respective queue currents, a constant differential voltage;

draws an error signal related to the difference of the two differential currents by means of a circuit portion comprised in said circuit structure; and applies this error signal to said first differential cell and to an output node of the circuit structure drawing a transconductance correlation independent from process tolerances and temperature.

2. A method according to claim 1, wherein the error signal application to said output node of the circuit structure occurs by means of an amplifier.

3. A method according to claim 1, wherein a current being proportional to said error signal is applied to bias circuit portions of the first type of transistors.

4. A method according to claim 1, wherein a current is applied on said output node of the circuit structure is applied to bias circuit portions of the first type of transistors by means of a mirror of one of said queue currents.

5. A circuit structure to correlate the transconductance value of transistors of different type, for example MOS transistors and bipolar transistors, wherein the circuit structure comprises a first differential cell formed by transistors of the first type and a second differential cell formed by transistors of the second type connected to each other by means of a circuit portion, comprised in said circuit structure, responsible for calculating an error signal as difference between the cell differential currents and applied to said first differential cell and to an output node of the same circuit structure obtaining a transconductance correlation independent from process tolerances and temperature.

6. A circuit structure according to claim 5, wherein said first differential cell is connected to a first potential reference by means of a current driven generator.

7. A circuit structure according to claim 6, wherein a current being proportional to said error signal is applied to bias circuit portions comprising transistors of the same type of said first differential cell.

8. A circuit structure according to claim 6, wherein the first cell comprises MOS transistors and the second cell comprises bipolar transistors and in that said cells are connected to each other by means of a cascode-connected current mirror circuit portion.

9. A circuit structure according to claim 8, wherein said current mirror circuit portion comprises MOS transistors.

10. A circuit structure according to claim 8, wherein said current mirror circuit portion comprises bipolar transistors.

11. A circuit structure according to claim 8, wherein said current driven generator is a bipolar transistor connected to the first differential cell.

12. A circuit structure according to claim 8, wherein both current generators driven by the node are MOS transistors.

13. A circuit structure according to claim 2, wherein said amplifier is a MOS transistor.

14. A circuit structure according to claim 8, wherein said current being proportional to said error signal is coupled to a variable gain amplifier equipped with a gain control circuit portion.

15. A circuit structure according to claim 14, wherein a bias current generated by said circuit structure is provided to said gain control circuit portion.

16. A bias circuit, comprising:
a first circuit including a first type of transistor and operable to receive a first bias signal and an input signal and to generate a first output signal in response to the input signal;
a second circuit including a second type of transistor and operable to receive a second bias signal and the input signal and to generate a second output signal in response to the input signal;
a first bias-signal generator operable to generate the second bias signal in response to a third bias signal; and
a second bias-signal generator coupled to the first and second circuits and to the first bias-signal generator and operable to generate the third bias signal in response to the first and second output signals.

17. The bias circuit of claim 16 wherein:
the first circuit comprises a differential pair of the first type of transistors; and
the second circuit comprises a differential pair of the second type of transistors.

18. The bias circuit of claim 16 wherein:
the first and second bias signals respectively comprise first and second bias currents;
the input signal comprises an input voltage; and
the first and second output signals respectively comprise first and second output currents.

19. The bias circuit of claim 16 wherein the third bias signal comprises a bias current.

20. The bias circuit of claim 16 wherein the third bias signal comprises a bias voltage.

21. The bias circuit of claim 16 wherein the first bias-signal generator comprises a comparator.

22. The bias circuit of claim 16 wherein the first bias-signal generator comprises a current mirror.

23. The bias circuit of claim 16 wherein the second bias-signal generator comprises a controllable current source.

24. The bias circuit of claim 16 wherein:
the first circuit includes only transistors of the first type; and
the second circuit includes only transistors of the second type.

25. A bias circuit, comprising:
a first differential pair of a first type of transistors having a bias node operable to receive a first bias current, first and second input nodes operable to receive a differential input voltage, and first and second output nodes;
a second differential pair of a second type of transistors having a bias node, first and second input nodes operable to receive the differential input voltage, and first and second output nodes;
a current mirror having an input node coupled to the first output node of the first differential pair and the second output node of the second differential pair and having an output node coupled to the second output node of the first differential pair and the first output node of the second differential pair; and
a bias-current generator having a control node coupled to the output node of the current mirror and having an output node coupled to the bias node of the second differential pair.

26. The bias circuit of claim 25 wherein the first and second types of transistors comprise bipolar transistors and MOS transistors, respectively.

27. An integrated circuit, comprising:
a first circuit including a first type of transistor and operable to receive a first bias signal and an input signal and to generate a first output signal in response to the input signal;

a second circuit including a second type of transistor and operable to receive a second bias signal and the input signal and to generate a second output signal in response to the input signal;

a first bias-signal generator operable to generate the first bias signal;

a second bias-signal generator operable to generate the second bias signal in response to a third bias signal; and a third bias-signal generator coupled to the first and second circuits and operable to generate the third bias signal in response to the first and second output signals.

28. The integrated circuit of claim 27, further comprising:

an amplifier circuit comprising a first amplifier having the first type of transistors and a second amplifier having the second type of transistors; and a gain control circuit operable to generate first and second bias signals for the first and second amplifiers, respectively, in response to the third bias signal.

29. An electronic system, comprising:

an integrated circuit, comprising, a first circuit including a first type of transistor and operable to receive a first bias signal and an input signal and to generate a first output signal in response to the input signal, a second circuit including a second type of transistor and operable to receive a second bias signal and the input signal and to generate a second output signal in response to the input signal, a first bias-signal generator operable to generate the first bias signal, a second bias-signal generator operable to generate the second bias signal in response to a third bias signal, and a third bias-signal generator coupled to the first and second circuits and operable to generate the third bias signal in response to the first and second output signals.

30. A method, comprising:

generating with a first type of transistor a first output signal in response to an input signal and a first bias signal;

generating with a second type of transistor a second output signal in response to the input signal and a second bias signal; and adjusting the second bias signal to a level that causes the second output signal to equal the first output signal with a predetermined accuracy.

31. The method of claim 30 wherein adjusting the second bias signal comprises generating a third bias signal, adjusting the second bias signal with the third bias signal, and biasing a second type of transistor with the third bias signal.

32. A method, comprising:

biasing a first differential amplifier having transistors of a first type with a first bias signal;

biasing a second differential amplifier having transistors of a second type with a second bias signal;

generating a first output signal by amplifying an input signal with the first differential amplifier;

generating a second output signal by amplifying the input signal with the second differential amplifier;

comparing the first and second output signals; and adjusting the first bias signal in response to the comparison of the first and second output signals.

33. The method of claim 32 wherein adjusting the first bias signal comprises:

reducing the first bias signal if the first output signal is greater than the second output signal; and increasing the first bias signal if the first output signal is less than the second output signal.

* * * * *

UNITED STATES PATENT AND TRADEMARK OFFICE
CERTIFICATE OF CORRECTION

PATENT NO. : 7,126,413 B2
APPLICATION NO. : 10/883577
DATED : October 24, 2006
INVENTOR(S) : Pietro Filoramo and Giovanni Cali It is certified that error appears in the above-identified patent and that said Letters Patent is hereby corrected as shown below:

On Title Page
Item 73
Change "Simicroelectronics, S.R.L." to --STMicroelectronics S.r.l.--
Item 75
Change "Syracuse (IT)" to --Siracusa (IT)--

Signed and Sealed this

Seventh Day of August, 2007

JON W. DUDAS
*Director of the United States Patent and Trademark Office*